United States Patent
Mackey

(10) Patent No.: US 9,202,833 B2
(45) Date of Patent: Dec. 1, 2015

(54) IMAGING SYSTEMS WITH BAFFLE GRIDS

(71) Applicant: Semiconductor Components Industries, LLC, Phoeniz, AZ (US)

(72) Inventor: Jeffrey Mackey, Danville, CA (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 17 days.

(21) Appl. No.: 14/185,816

(22) Filed: Feb. 20, 2014

(65) Prior Publication Data

US 2015/0054103 A1    Feb. 26, 2015

Related U.S. Application Data

(60) Provisional application No. 61/869,515, filed on Aug. 23, 2013.

(51) Int. Cl.
*H01L 27/146*    (2006.01)

(52) U.S. Cl.
CPC .... *H01L 27/14621* (2013.01); *H01L 27/14627* (2013.01); *H01L 27/14629* (2013.01); *H01L 27/14685* (2013.01)

(58) Field of Classification Search
CPC .......................... H01L 27/146; H01L 31/0216
USPC ....................................................... 257/432
See application file for complete search history.

(56) References Cited

U.S. PATENT DOCUMENTS

| | | | |
|---|---|---|---|
| 7,335,963 B2 * | 2/2008 | Ford | 257/435 |
| 8,629,930 B2 | 1/2014 | Brueckner | |
| 8,716,823 B2 | 5/2014 | Lenchenkov | |
| 2007/0080415 A1 * | 4/2007 | Cho | 257/432 |
| 2012/0147228 A1 | 6/2012 | Duparre | |
| 2012/0261781 A1 * | 10/2012 | Hsu et al. | 257/432 |
| 2014/0084141 A1 | 3/2014 | Akiyama | |

* cited by examiner

*Primary Examiner* — Marc Armand
(74) *Attorney, Agent, or Firm* — Treyz Law Group, P.C.; Kendall P. Woodruff

(57) ABSTRACT

An imaging system may include a camera module with an image sensor having an array of image sensor pixels. The image sensor may include a substrate having an array of photodiodes, an array of microlenses formed over the array of photodiodes, and an array of color filter elements interposed between the array of microlenses and the array of photodiodes. A grid of baffles may be formed over the array of image pixels and may be configured to block stray light from striking the image pixels. The baffles may extend above the microlens array and may be tilted at an angle with respect to the optical axis of the image sensor. The angle at which each baffle is tilted may be proportional to the chief ray angle of an associated microlens. Baffles may be formed from a light-blocking material such as metal, photoresist, carbon, graphite, or other suitable material.

19 Claims, 7 Drawing Sheets

IMAGING SYSTEMS WITH BAFFLE GRIDS

This application claims the benefit of provisional patent application No. 61/869,515, filed Aug. 23, 2013, which is hereby incorporated by reference herein in its entirety.

BACKGROUND

This relates generally to imaging systems and, more particularly, to imaging systems with baffle grids for blocking stray light.

Image sensors are commonly used in electronic devices such as cellular telephones, cameras, and computers to capture images. In a typical arrangement, an electronic device is provided with an array of image pixels and one or more lenses that focus image light onto the array of image pixels. Circuitry is commonly coupled to each pixel column for reading out image signals from the image pixels.

In conventional imaging systems, stray light and optical crosstalk can cause unwanted image artifacts such as veiling glare, local flare, and shading effects. For example, light may enter an imaging system and may be reflected back and forth between surfaces of lens elements in the imaging system before finally reaching the array of image pixels. In other situations, stray light may enter the imaging system at a high angle of incidence and may be directed on an unintended path, leading to optical crosstalk. This type of stray light and optical crosstalk can cause bright streaks, reduced contrast, shading effects, and, in some cases, undesirable color tints in dark regions of an image.

It would therefore be desirable to be able to provide imaging systems with reduced optical crosstalk.

DETAILED DESCRIPTION

Electronic devices such as digital cameras, computers, cellular telephones, and other electronic devices may include image sensors that gather incoming light to capture an image. An image sensor may include one or more arrays of image pixels. The image pixels may include photosensitive elements such as photodiodes that convert the incoming light into image signals. An image sensor may have any number of pixels (e.g., hundreds, thousands, millions or more). A typical image sensor may, for example, have hundreds of thousands or millions of pixels (e.g., megapixels). Image sensors may include control circuitry such as circuitry for operating the image pixels, readout circuitry for reading out image signals corresponding to the electric charge generated by the photosensitive elements, and, if desired, other processing circuitry such as analog processing circuitry and digital processing circuitry. An image sensor may be coupled to additional processing circuitry such as circuitry on a companion chip to the image sensor, circuitry in the device that is coupled to the image sensor by one or more cables or other conductive lines, or external processing circuitry.

Figure 1:
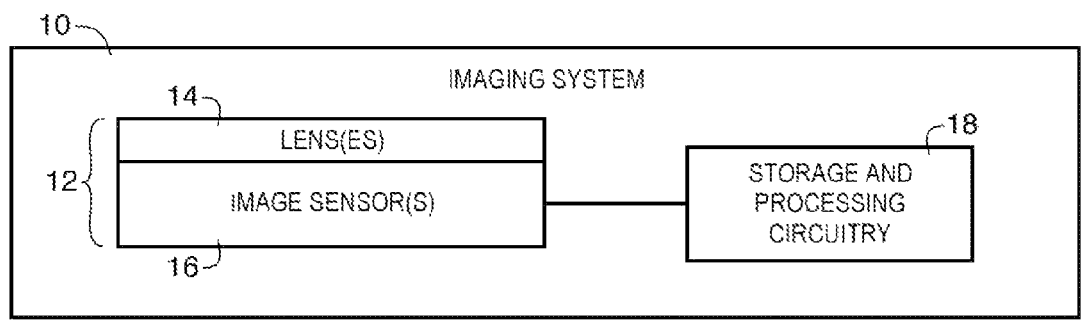
FIG. 1 is a diagram of an illustrative imaging system in accordance with an embodiment of the present invention.

FIG. 1 is a diagram of an illustrative electronic device that uses an image sensor to capture images. Electronic device 10 of FIG. 1 may be a portable electronic device such as a camera, a cellular telephone, a video camera, or other imaging device that captures digital image data. Camera module 12 may be used to convert incoming light into digital image data. Camera module 12 may include one or more lenses 14 and one or more corresponding image sensors 16. During image capture operations, light from a scene may be focused onto image sensor 16 by lens 14. Image sensor 16 may include circuitry for converting analog pixel data into corresponding digital image data to be provided to processing circuitry 18. If desired, camera module 12 may be provided with an array of lenses 14 and an array of corresponding image sensors 16.

Processing circuitry 18 may include one or more integrated circuits (e.g., image processing circuits, microprocessors, storage devices such as random-access memory and non-volatile memory, etc.) and may be implemented using components that are separate from camera module 12 and/or that form part of camera module 12 (e.g., circuits that form part of an integrated circuit that includes image sensors 16 or an integrated circuit within module 12 that is associated with image sensors 16). Image data that has been captured by camera module 12 may be processed and stored using processing circuitry 18. Processed image data may, if desired, be provided to external equipment (e.g., a computer or other device) using wired and/or wireless communications paths coupled to processing circuitry 18.

Figure 2:
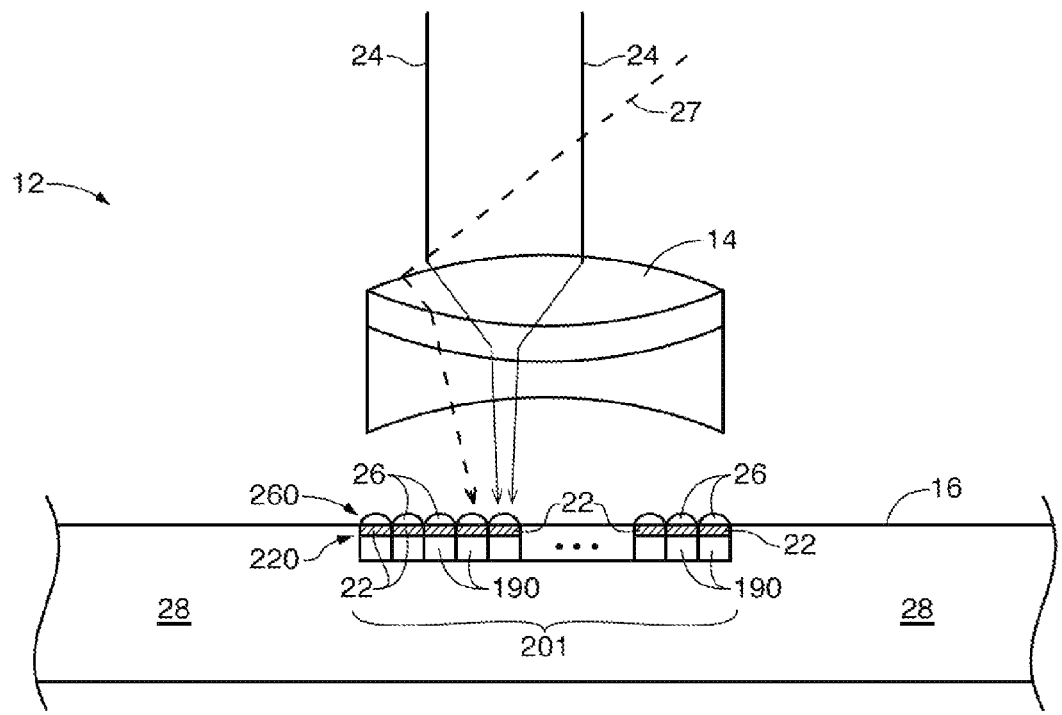
FIG. 2 is cross-sectional side view of an illustrative camera module showing how image light and stray light may pass through one or more lenses onto an image pixel array in accordance with an embodiment of the present invention.

As shown in FIG. 2, image sensor 16 of camera module 12 may include one or more arrays of image pixels such as image pixel array 201 containing image sensor pixels 190 (sometimes referred to herein as image pixels 190). Image pixel array 201 may be formed in a substrate such as image sensor substrate 28. Image pixel array 201 may include, for example, hundreds or thousands of rows and columns of image sensor pixels 190. Each image sensor pixel 190 may include a photosensitive element such as a photodiode for receiving incoming light and for generating an electric charge corresponding to the amount of light received.

Image pixel array 201 may include a color filter array 220 having an array of color filter elements such as color filter elements 22. Each color filter element 22 may be formed over a photosensitive element in an associated one of image pixels 190. Color filter array 220 may be covered by a corresponding microlens array 260 having an array of microlenses such as microlenses 26. Color filter elements 22 may include red color filter elements (e.g., color filter material that passes red light while reflecting and/or absorbing other colors of light), blue color filter elements (e.g., color filter material that passes blue light while reflecting and/or absorbing other colors of light), green color filter elements (e.g., color filter material that passes green light while reflecting and/or absorbing other colors of light), yellow color filter elements (e.g., yellow color filter material that passes red and green light), clear color filter elements (e.g., transparent material that passes red, blue, and green light), and/or color filter elements of other colors (e.g., cyan, magenta, etc.). If desired, some image pixels 190 may not include color filter elements. Image pixels that do not include color filter elements and image pixels that are provided with clear color filter elements may sometimes be referred to as clear pixels, white pixels, clear image pixels, or white image pixels.

As shown in FIG. 2, one or more lenses such as lens 14 (e.g., a lens having one or more convex lens elements, concave lens elements, or other lens elements) may focus light such as image light 24 onto image pixels 190. Image light 24 originates within the field-of-view of camera module 12 and follows a predictable path through lens 14 onto image sensor 16.

In some situations, light that originates outside of the field-of-view of camera module 12 such as stray light 27 may follow a path through a portion of lens 14 and onto image sensor 16. In other situations, stray light may be generated by light that enters the imaging system and is reflected back and forth between surfaces of lens elements in lens 14 before finally reaching the array of image pixels. The changes in refractive indices that occur at air-plastic interfaces and air-glass interfaces can cause the reflected light to follow an unintended path towards image pixels 190. In the example of FIG. 2, stray light 27 reflects from an upper edge of lens 14 through a lower edge of lens 14 and onto image pixels 190. This is merely illustrative. Stray light (e.g., from a bright light source such as the sun, the moon, a street light, a light bulb, etc.) may take various paths onto image sensor 16. If care is not taken, stray light may exacerbate optical crosstalk and may in turn lead to image artifacts such as flare artifacts, shading effects, and veiling glare artifacts.

Figure 3:
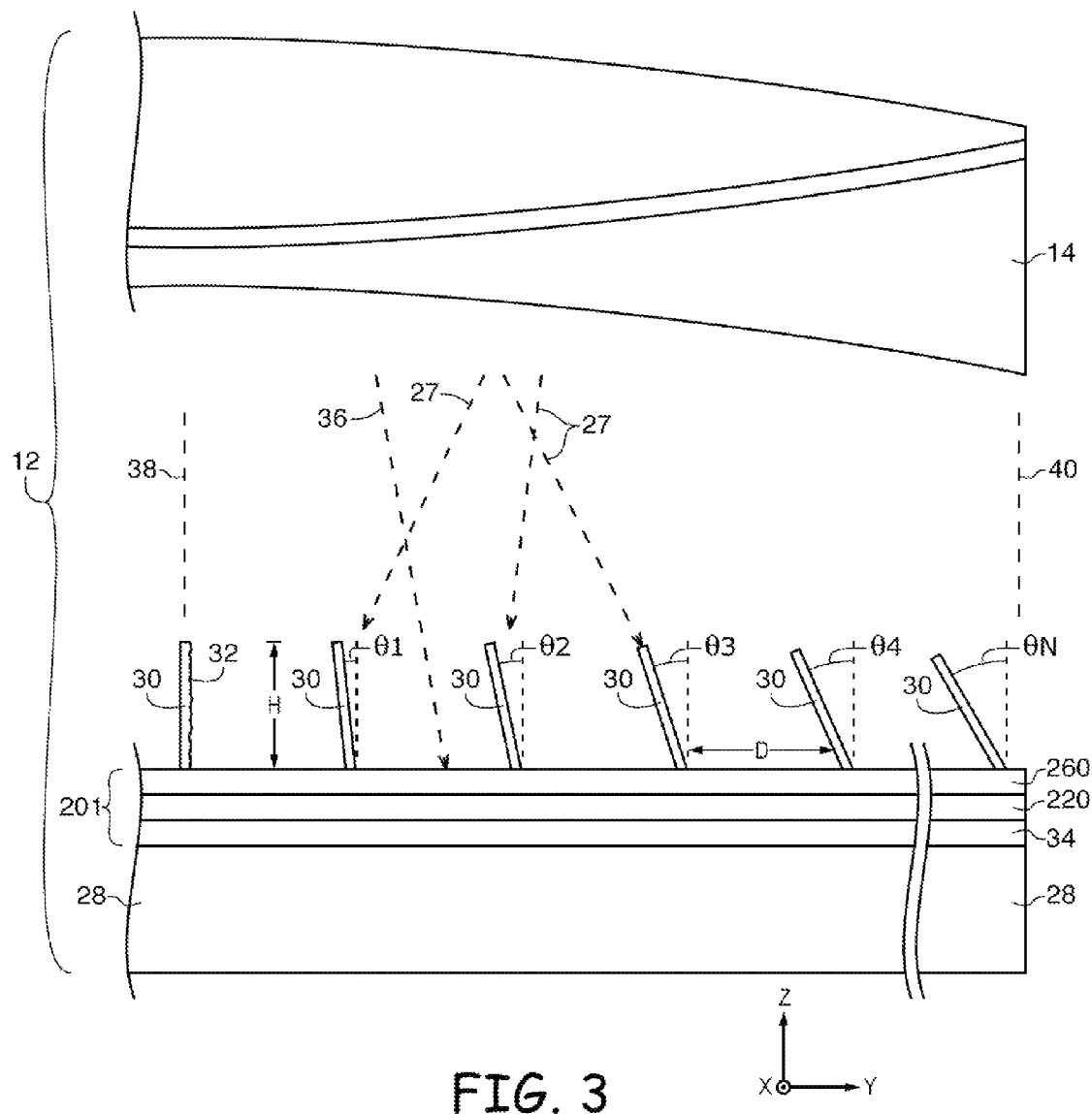
FIG. 3 is a cross-sectional side view of a portion of an illustrative image sensor having crosstalk reduction structures formed above a microlens array in the image sensor in accordance with an embodiment of the present invention.

To reduce optical crosstalk and image artifacts caused by stray light, image sensor 16 may include a grid of light-blocking structures such as baffles that block stray light from entering pixel array 201. FIG. 3 is a cross-sectional side view of a portion of camera module 12 showing how a grid of baffles may be formed over pixel array 201. As shown in FIG. 3, pixel array 201 may include color filter array layer 220 interposed between microlens array layer 260 and image pixel circuitry layer 32. Image pixel circuitry layer 32 may include, for example, photodiodes, metal interconnect layers having metal control lines, and other pixel circuitry. A grid of baffles such as baffles 30 (sometimes referred to as louvers, crosstalk reduction structures, light barriers, or light-blocking structures) may be formed over pixel array 201.

Baffles 30 may be used to block stray light such as stray light 27 while passing image light having an acceptable angle of incidence such as image light 36. As shown in FIG. 3, some or all of baffles 30 may be angled with respect to the optical axis of image sensor 16 (e.g., an optical axis parallel to the z-axis of FIG. 3). In this way, baffles 30 may achieve a venetian blind effect whereby light that enters at excessively high angles of incidence (e.g., light that originates from outside of the field of view of the camera) is prevented from striking image pixel array 201 and causing optical crosstalk and image artifacts.

The angle at which each baffle 30 is tilted with respect to the optical axis of the image sensor may be based on the lateral distance of the baffle from the center of the optical array. In other words, the angle at which each baffle 30 is tilted may depend on where the baffle is located in the image sensor. For example, dashed line 38 of FIG. 3 may coincide with the center of pixel array 201 and dashed line 40 may coincide with the edge of pixel array 201. At center 38 of pixel array 201, baffles 30 may be oriented at a 0° angle with respect to the optical axis of image sensor 16. At peripheral edges 40 of pixel array 201, baffles 30 may be oriented at an angle $\Theta N$ that is larger than 0°. As shown in FIG. 3, the angles at which baffles 30 are tilted may, for example, increase from $\Theta 1$ to $\Theta 2$, from $\Theta 2$ to $\Theta 3$, from $\Theta 3$ to $\Theta 4$, etc.

The angle at which baffles 30 are tilted with respect to the optical axis of image sensor 16 may, if desired, be commensurate with chief ray angle. A chief ray is defined as a light ray from an off-axis object point that passes through the center of an aperture stop of an optical system. The chief ray angle (CRA) is the angle between the optical axis of the optical system and the chief ray. Pixels located at the periphery of a pixel array have a higher CRA than pixels located near the center of the pixel array. For example, microlenses at center 38 of pixel array 201 may be associated with a CRA of 0° or close to 0°, while microlenses at edge 40 of pixel array 201 may be associated with a CRA of 28° or close to 28° (as an example). The CRA at outermost pixels in pixel array 201 depends on the particular construction of camera module 12 and image sensor 16, and can vary greatly from one camera design to the next. In general, the CRA at outermost pixels in pixel array 201 may be any suitable angle (e.g., 15°, 20°, 25°, 30°, more than 30°, less than 30°, etc.).

The angle at which each baffle 30 is tilted with respect to the optical axis of image sensor 16 may be based on the CRA associated with the microlens over which the baffle 30 is formed. For example, $\Theta N$ of baffle 30 at edge 40 may be equal to or proportional to the CRA associated with the microlens at edge 40 over which baffle 30 is formed. Whereas $\Theta 1$ of baffle 30 near center 38 may be equal to or proportional to the CRA associated with the microlens near center 38 over which baffle 30 is formed. By configuring baffles 30 such that the tilt angle is commensurate with the CRA of respective microlenses 26, rejection of stray light 27 may be maximized, while reduction of image light 36 at acceptable angles of incidence may be minimized.

In the illustrative example of FIG. 3, each baffle extends across array 201 in a direction parallel to the x-axis of FIG. 3 to form a grid of parallel lines. If desired, a second layer of baffles may be formed above baffles 30 and may extend in direction parallel to the y-axis of FIG. 3. In this way, the first and second layers of baffles 30 may together form a grid of crisscrossing vertical and horizontal lines. The use of multiple layers of baffles extending in different directions with respect to each other is, however, merely illustrative. If desired, image sensor 16 may include only one layer of baffles 30.

The spacing between baffles 30 may, if desired, be an integer multiple of the pixel pitch (e.g., the vertical pitch or the horizontal pitch) associated with pixels 190 in pixel array 201. For example, distance D between adjacent baffles 30 may be equal to the pixel pitch, twice the pixel pitch, three times the pixel pitch, more than three times the pixel pitch, etc. Baffles 30 may have any suitable height H (e.g., 250 nm, 300 nm, 350 nm, 400 nm, 800 nm, less than 800 nm, more than 800 nm, etc.). If desired, baffles 30 may a height that is approximately equal to the height of microlenses 26 (as an example). Baffles 30 may all have the same height H, or baffles 30 may have more than one height.

Baffles 30 may be formed from a light-blocking material such a tungsten, aluminum, other metals, color filter material (e.g., photoresist), amorphous carbon, graphite, organic materials, other suitable materials, or a combination of any two or more of these materials. If desired, baffles 30 may be provided with light-disrupting structures such as light-disrupting structures 32. Light-disrupting structures 32 may, for example, be formed from a roughened surface or a surface having pits, bumps, or other light-blocking features. Light-disrupting structures 32 may be formed from a surface of baffle 30 (e.g., by roughening the surface of baffle 30 directly) or may be separate from baffle 30 (e.g., a coating, film, or other separate structure).

If desired, baffles 30 may be implemented in image sensors having curved silicon substrates.

Figure 4:
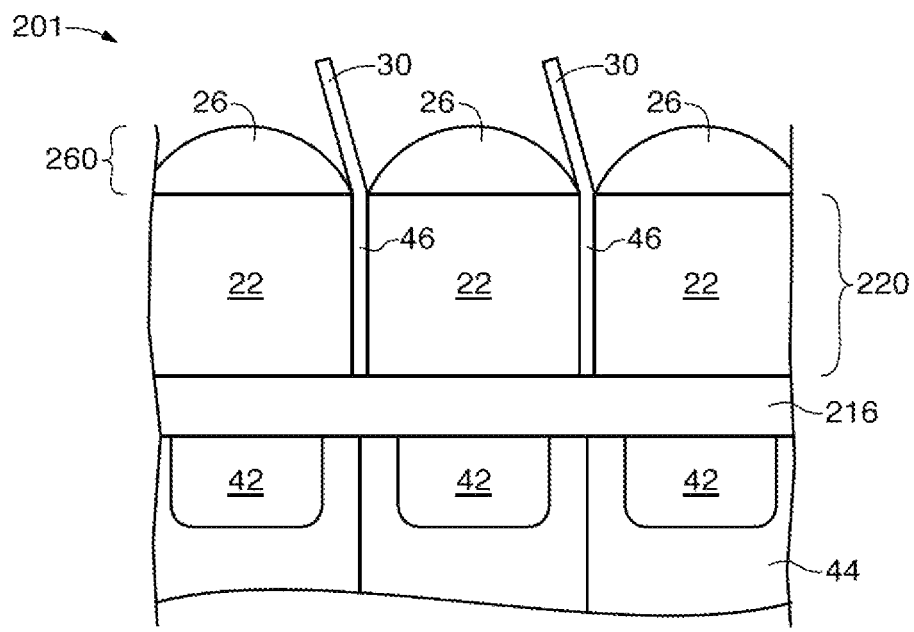
FIG. 4 is a cross-sectional side view of a portion of an illustrative image pixel array having crosstalk reduction structures that extend from color filter barriers in accordance with an embodiment of the present invention.

Baffles 30 may be formed on any suitable surface in pixel array 201. In one suitable embodiment, baffles 30 may be formed as an extension of the color filter barriers that separate individual color filter elements 22 in color filter array 220. FIG. 4 is a cross-sectional side view of a portion of pixel array 201 showing how baffles 30 may extend from color filter barriers in color filter array 220.

As shown in FIG. 4, pixel array 201 may include an array of photosensitive regions such is photodiodes 42 formed in substrate layer 44 (e.g., a silicon substrate or other suitable image sensor substrate). Color filter array 220 may be formed over the array of photodiodes 42. Color filter array 220 may be interposed between microlens array 260 and the array of photodiodes 42. An optional stack of dielectric layers such as dielectric layers 216 may be interposed between color filter array 180 and photodiodes 220. Dielectric layers 216 may, for example, include a layer of anti-reflective coating to minimize reflective losses at the surface of image sensor substrate 44.

Each pixel 190 may include microlens 26, color filter 22, optional dielectric layers 216, and photosensitive region 42 formed in substrate layer 44. Each microlens 26 may direct incident light towards associated photosensitive region 42.

A grid of color filter barriers such as barriers 46 may be formed as part of color filter array 220. Each barrier 46 may be interposed between two adjacent color filter elements 22 and may help reduce optical crosstalk between neighboring pixels. Suitable materials that may be used to form color filter barriers 46 include oxides such as silicon dioxide or other suitable oxides, photoresist, ceramic, titanium nitride, tungsten, anodized aluminum, copper, other suitable metals or materials, or a combination of any two or more of these materials. Each barrier 46 may help prevent light that passes through the microlens of one pixel from striking the photosensitive region of another pixel.

If desired, each color filter 22 in color filter array 220 may be separated from ever adjacent color filter 22 by a color filter barrier such as barrier 46. With this type of arrangement, color filter barriers 46 form a grid having an array of openings, and color filters 22 may be located in the openings. This is, however, merely illustrative. If desired, color filter barriers 46 may be selectively interposed between adjacent color filters 22.

In the illustrative example of FIG. 4, baffles 30 are formed as an extension of color filter barriers 46. Baffles 30 may be formed from the same material as barriers 46 or may, if desired, be formed from a different material than barriers 46. In one suitable arrangement, the grid of openings formed by color filter barriers 46 may be filled with color filter elements 22 prior to forming baffles 30 on top of barriers 46. In another suitable arrangement, barriers 46 and baffles 30 may be formed before color filter elements 22 are deposited in the grid of openings. Microlenses 26 may be formed over color filter elements 22 before or after baffles 30 are formed.

Figure 5:
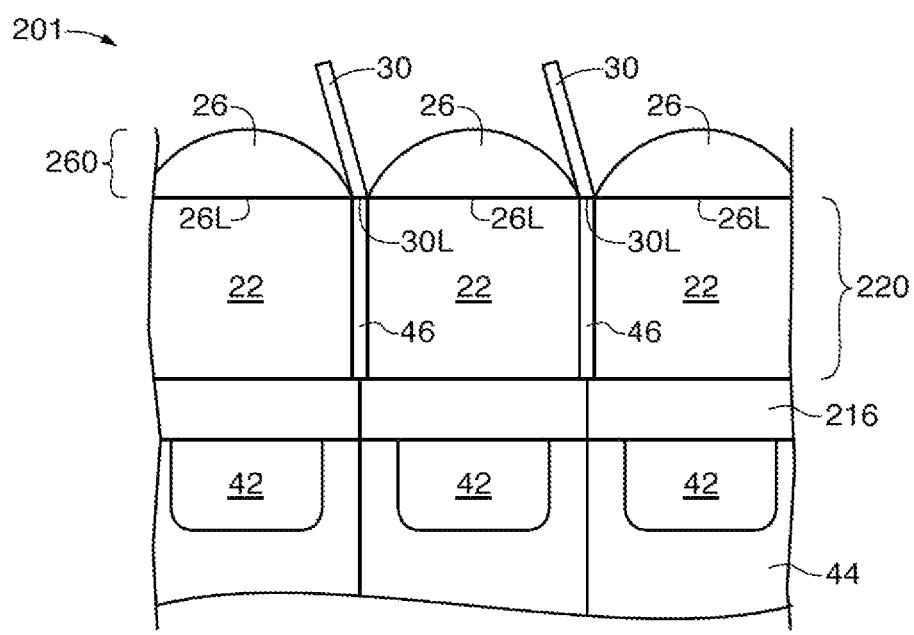
FIG. 5 is a cross-sectional side view of a portion of an illustrative image pixel array having crosstalk reduction structures with lower surfaces that are coplanar with a lower surface of a microlens array in accordance with an embodiment of the present invention.

If desired, the lower surfaces of baffles 30 may be coplanar with the lower surfaces of microlenses 26. This type of arrangement is shown in FIG. 5. As shown in FIG. 5, lower surface 30L of baffles 30 is coplanar with lower surface 26L of microlenses 26. Microlenses 26 may be formed over color filter elements 22 before or after baffles 30 are formed.

Figure 6:
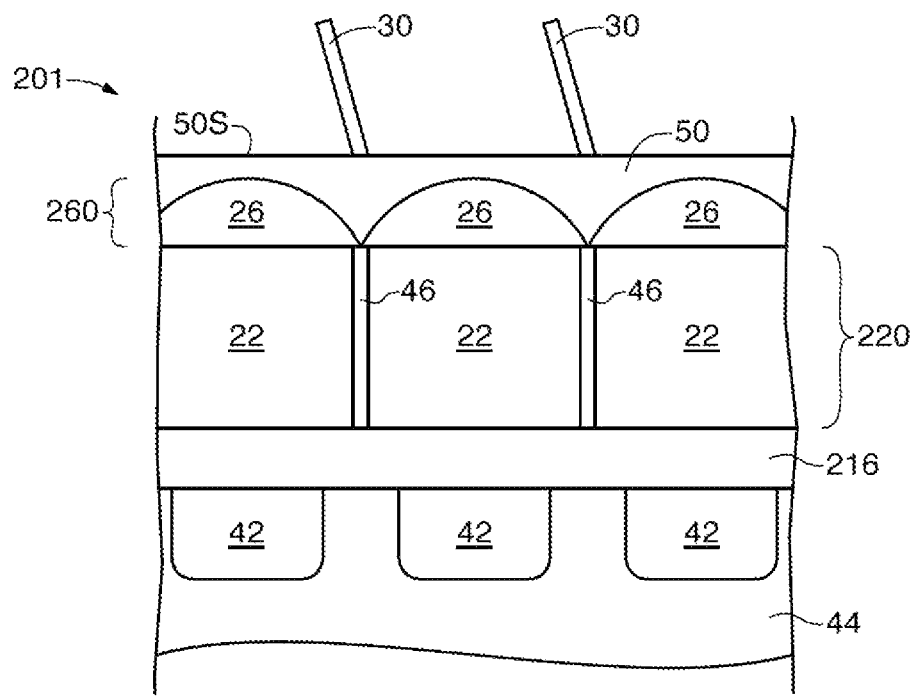
FIG. 6 is a cross-sectional side view of a portion of an illustrative image pixel array having crosstalk reduction structures formed on a transparent layer of material above a microlens array in accordance with an embodiment of the present invention.

In another suitable arrangement, baffles 30 may be formed on a transparent layer of material above the microlens array. For example, as shown in FIG. 6, a transparent fill material such as transparent fill material 50 may be deposited over microlens array 260 and may form a planar surface 50S. Baffles 30 may be formed on surface 50S of material 50. Suitable materials that may be used for material 50 include silicon dioxide, other oxides, photoresist, polymers, adhesive, ceramic, other materials, a combination of any two or more of these materials, etc. In the example of FIG. 6, material 50 fills the regions between adjacent microlenses 26.

Figure 7:
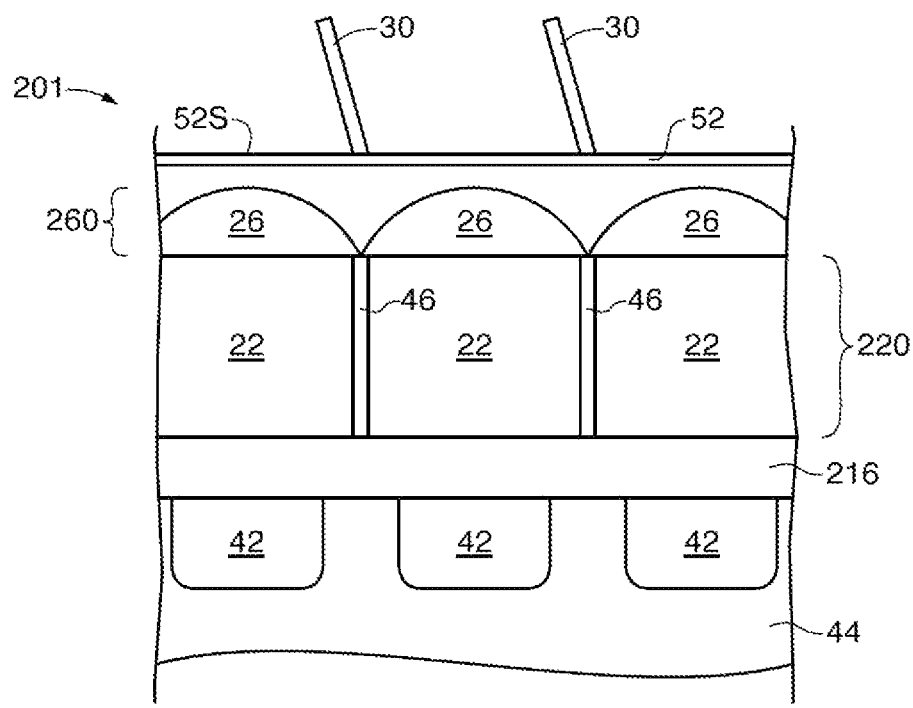
FIG. 7 is a cross-sectional side view of a portion of an illustrative image pixel array having crosstalk reduction structures formed on a thin sheet of transparent material above a microlens array in accordance with an embodiment of the present invention.

If desired, baffles 30 may be formed on a thin sheet of transparent material above the microlens array. For example, as shown in FIG. 7, pixel array 201 may include transparent sheet 52 above microlens array 260. Baffles 30 may be formed on surface 52S of transparent sheet 52. Transparent sheet 52 may be a thin sheet of glass, polymer, ceramic, or other suitable material.

The examples of FIGS. 4-7 in which image sensor 16 is a backside illuminated image sensor is merely illustrative. Baffle grids may also be implemented in front side illuminated image sensors.

Figure 8:
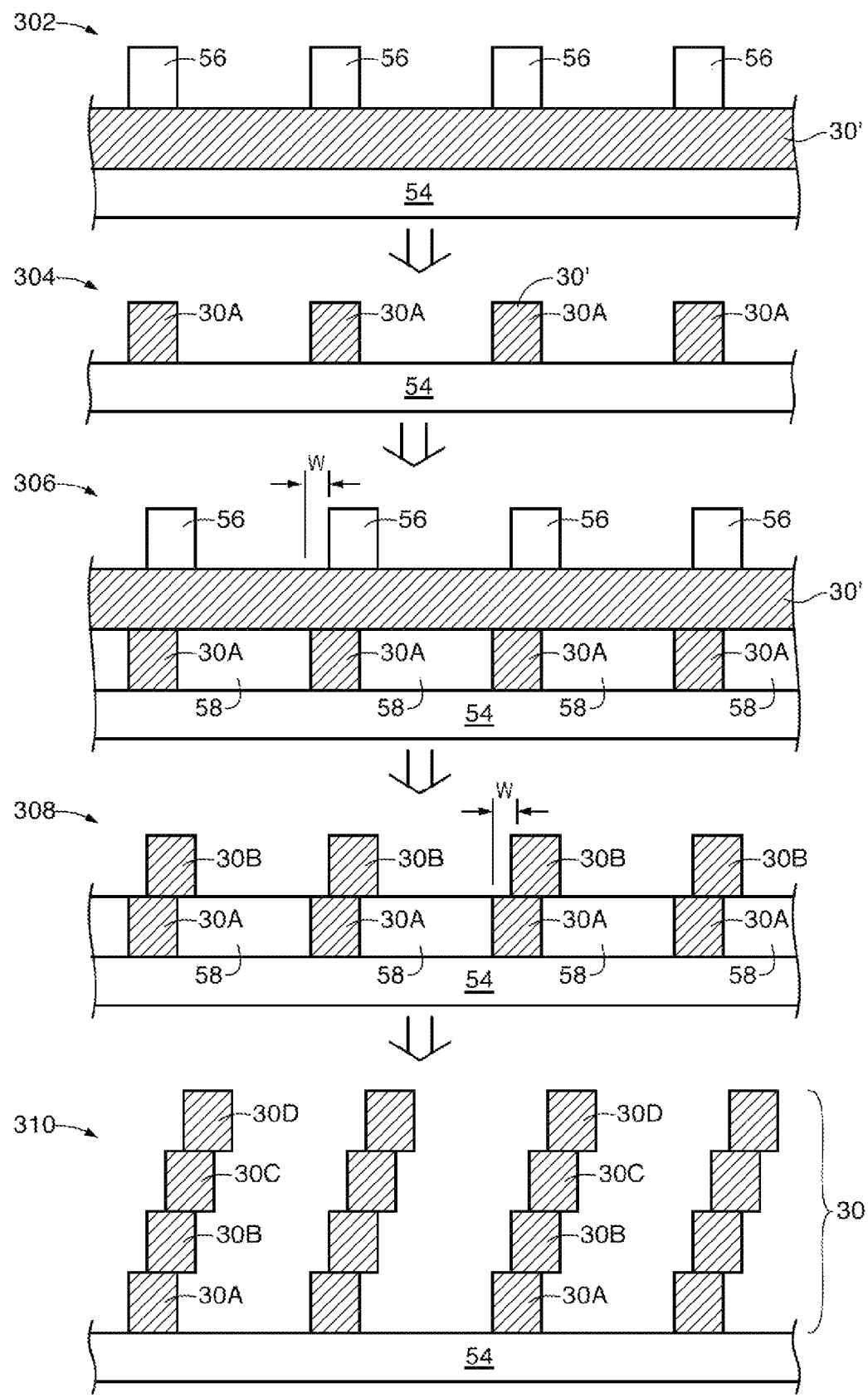
FIG. 8 is a diagram of illustrative steps involved in forming crosstalk reduction structures using a graduated overlay approach in accordance with an embodiment of the present invention.

FIG. 8 is a diagram of illustrative steps involved in forming baffles 30 using a graduated overlay approach.

At step 302, baffle material 30' may be deposited on substrate layer 54. Substrate layer 54 may correspond to the substrate on which baffles 30 are formed (e.g., substrate 54 may include surfaces of color filter barriers 46, color filter elements 22, layer 50 of FIG. 6, layer 52 of FIG. 7, etc.). Material 56 (e.g., photoresist or other suitable material) may then be deposited and patterned on baffle material 30'. The portions of photoresist 56 that remain after patterning may act as an etch block over baffle material 30'.

At step 304, baffle material 30' may be etched to remove portions of baffle material 30' that are not covered by photoresist 56. Photoresist 56 may then be removed. The remaining baffle material 30' on substrate 54 may form bottom layer 30A of baffle 30.

At step 306, a fill material such as fill material 58 may be deposited in between baffle portions 30A. Fill material 58 (e.g., a layer of silicon dioxide or other suitable material) may have an upper surface that is coplanar with the upper surface of baffle portions 30A (i.e., fill material 58 may have the same height with respect to substrate 54 as baffle portions 30A). Another layer of baffle material 30' may be formed over the flat surface formed by baffle portions 30A and fill material 58. Photoresist 56 may then be deposited and patterned on baffle material 30'. The portions of photoresist 56 that remain after patterning may be laterally offset from baffle portions 30A by a distance W.

At step 308, baffle material 30' may be etched to remove portions of baffle material 30' that are not covered by photoresist 56. Photoresist 56 may then be removed. The remaining baffle material 30' on substrate 54 may form an additional layer 30B of baffle 30. Baffle portion 30B may be laterally offset from baffle portion 30A by a distance W.

At step 310, steps 306 and 308 are iterated until baffle 30 reaches the desired height. In the illustrative example of FIG. 8, baffle 30 is formed from baffle portions 30A, 30B, 30C, and 30D. This is, however, merely illustrative. In general, baffle 30 may be formed from any suitable number of individual baffle portions. After baffle 30 has reached the desired height, fill material 58 may be removed.

Figure 9:
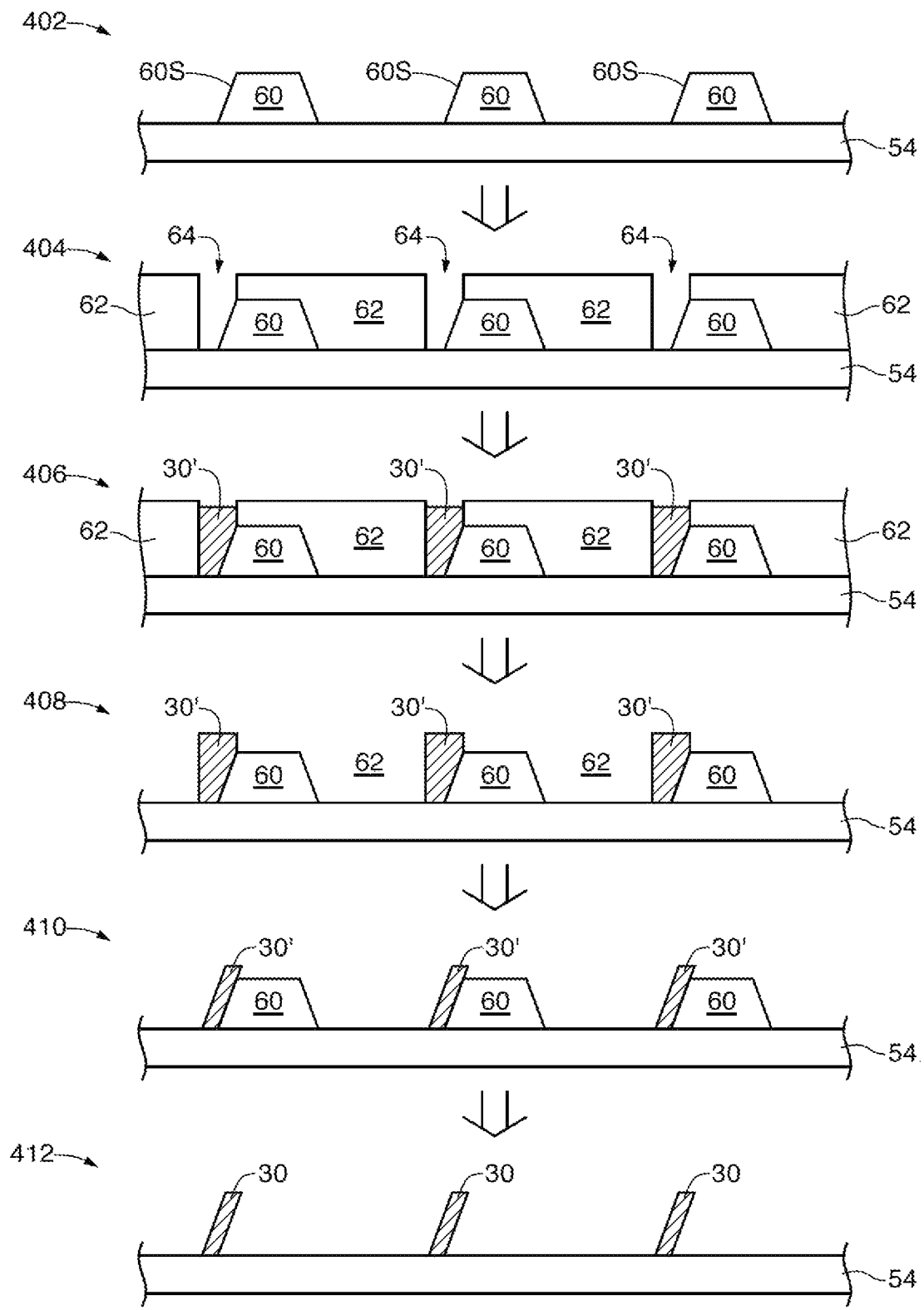
FIG. 9 is a diagram of illustrative steps involved in forming a color filter array having crosstalk reduction structures using a sidewall deposition approach in accordance with an embodiment of the present invention.

FIG. 9 is a diagram of illustrative steps involved in forming baffles 30 using a sidewall deposition approach.

At step 402, a template material such as template material 60 may be deposited on substrate 54 and etched to form structures having slanted sidewalls 60S. Template material 60 may, for example, be silicon dioxide or other suitable material.

At step 404, material 62 (e.g., photoresist or other suitable material) may be deposited over template material 60 on substrate 54 and subsequently patterned. Portions of photoresist 62 that remain after patterning may form gaps 64 next to template material 60.

At step 406, baffle material 30' may be deposited in gaps 64. If desired, chemical-mechanical planarization may be used to smooth surfaces such as surfaces of baffle material 30'. At step 408, photoresist 62 may be removed.

At step 410, baffle material 30' may optionally be etched to adjust the geometry of each baffle structure. In the example of FIG. 9, baffle material 30' is etched so that each baffle structure has two opposing slanted surfaces along its length (e.g., two parallel slanted surfaces).

At step 412, template material 60 may be removed, leaving baffles 30 on substrate 54.

The processes described in connection with FIGS. 8 and 9 are merely illustrative. If desired, each process may include additional or alternative steps, or other suitable processes may be used to form baffles 30. For example, techniques such as ion beam machining and electron beam lithography may be employed to produce baffles 30.

Figure 10:
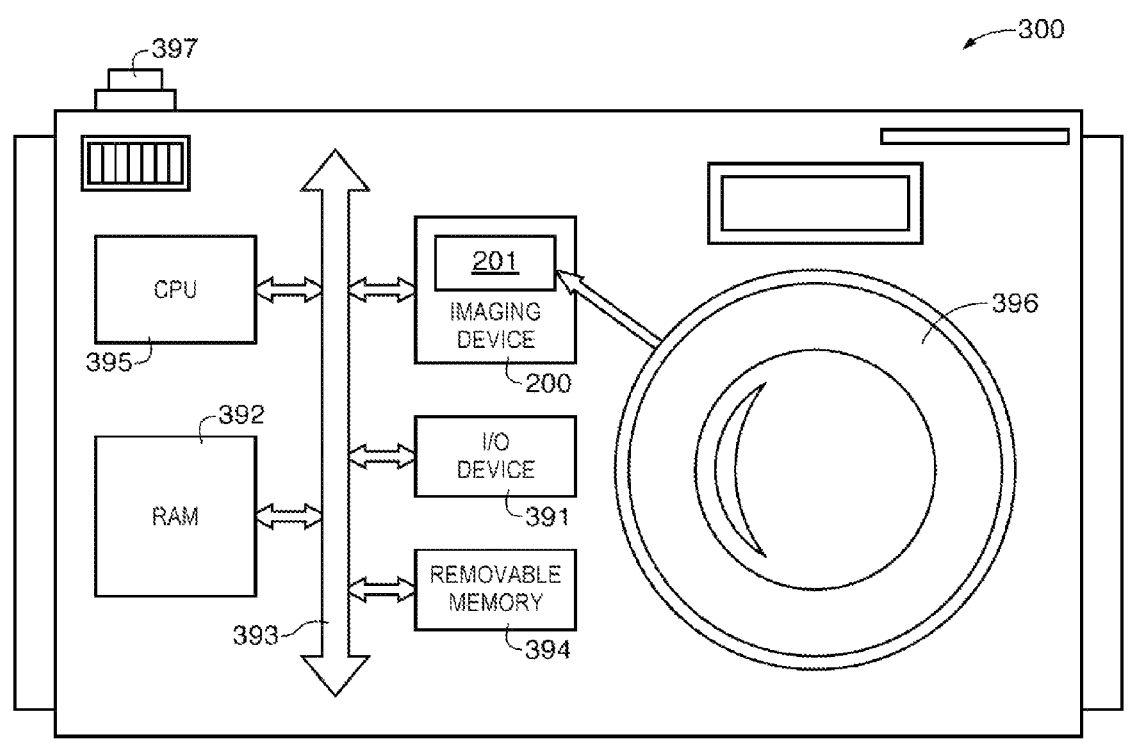
FIG. 10 is a block diagram of a processor system employing the embodiments of FIGS. 1-9 in accordance with an embodiment of the present invention.

FIG. 10 shows in simplified form a typical processor system 300, such as a digital camera, which includes an imaging device 200. Imaging device 200 may include a pixel array 201 having a grid of baffles 30 of the type shown in FIG. 3. Processor system 300 is exemplary of a system having digital circuits that may include imaging device 200. Without being limiting, such a system may include a computer system, still or video camera system, scanner, machine vision, vehicle navigation, video phone, surveillance system, auto focus system, star tracker system, motion detection system, image stabilization system, and other systems employing an imaging device.

Processor system 300, which may be a digital still or video camera system, may include a lens such as lens 396 for focusing an image onto a pixel array such as pixel array 201 when shutter release button 397 is pressed. Processor system 300 may include a central processing unit such as central processing unit (CPU) 395. CPU 395 may be a microprocessor that controls camera functions and one or more image flow functions and communicates with one or more input/output (I/O) devices 391 over a bus such as bus 393. Imaging device 200 may also communicate with CPU 395 over bus 393. System 300 may include random access memory (RAM) 392 and removable memory 394. Removable memory 394 may include flash memory that communicates with CPU 395 over bus 393. Imaging device 200 may be combined with CPU 395, with or without memory storage, on a single integrated circuit or on a different chip. Although bus 393 is illustrated as a single bus, it may be one or more buses or bridges or other communication paths used to interconnect the system components.

Various embodiments have been described illustrating image sensors with light-blocking structures such as a grid of baffles.

An imaging system may include a camera module with an array of image sensor pixels and one or more lenses that focus light onto the array of image sensor pixels. The array of image sensor pixels may include a color filter array interposed between a microlens array and an array of photodetectors. The array of image sensor pixels may include a grid of baffles that extend above the microlens array.

Some of the baffles may be oriented at an angle with respect to the optical axis of the image sensor. The angle at which the baffles are tilted with respect to the optical axis of the image sensor may be commensurate with the chief ray angle (CRA) of the microlens array. For example, the angle at which the baffles are tilted with respect to the optical axis of the image sensor may increase as the distance from the baffle to the center of the pixel array increases. If desired, baffles at the center of the pixel array may be parallel to the optical axis, while outermost baffles at the periphery of the pixel array may be tilted at a maximum angle with respect to the optical axis (e.g., a maximum angle relative to the angles at which other baffles in the grid are tilted). Tilting each baffle by an amount that is proportional to the CRA of the microlens over which the baffle is formed ensures that reduction in signals corresponding to stray light at high angles of incidence is maximized while reduction in image signals corresponding to image light at acceptable angles of incidence in minimized.

In one suitable embodiment, the baffles may be formed as extensions of color filter barriers that separate color filter elements in the color filter array. In another suitable embodiment, the lower surfaces of the baffles are coplanar with the lower surfaces of microlenses in the microlens array. In yet another suitable embodiment, the baffles are formed on a surface above the microlens array (e.g., a fill material that is deposited over the microlens array or a thin sheet of glass that has been incorporated into the camera module over the microlens array).

Baffles may be formed from a light-blocking material such a tungsten, aluminum, other metals, color filter material (e.g., photoresist), amorphous carbon, graphite, organic materials, other suitable materials, or a combination of any two or more of these materials. The baffles may be formed using a graduated overlay approach, may be formed using a sidewall deposition approach, or may be formed using other suitable fabrication techniques.

The foregoing is merely illustrative of the principles of this invention which can be practiced in other embodiments.

What is claimed is:

1. An image sensor having an array of image pixels, comprising:
   a substrate;
   an array of photodiodes formed in the substrate;
   an array of microlenses formed over the array of photodiodes;
   an array of color filter elements interposed between the array of microlenses and the array of photodiodes;

a grid of baffles that extend above the array of microlenses, wherein the grid of baffles is configured to block stray light from reaching the array of image pixels; and a material formed over the array of microlenses, wherein the material has a planar surface and wherein the baffles are formed on the planar surface.

2. The image sensor defined in claim 1 wherein the image sensor has an optical axis and wherein each baffle is tilted at an angle with respect to the optical axis of the image sensor.

3. The image sensor defined in claim 1 wherein the baffles comprise metal.

4. The image sensor defined in claim 1 wherein the baffles comprise photoresist material.

5. The image sensor defined in claim 1 further comprising a grid of color filter barriers, wherein each color filter barrier is interposed between a respective pair of the color filter elements, and wherein each baffle extends from one of the color filter barriers.

6. The image sensor defined in claim 1 wherein the array of image pixels has an associated pixel pitch, and wherein a spacing between adjacent baffles in the grid of baffles is an integer multiple of the pixel pitch.

7. The image sensor defined in claim 2 wherein each microlens is associated with a chief ray angle and wherein the angle at which the baffles are tilted is based on the chief ray angle of an associated microlens.

8. The image sensor defined in claim 2 wherein the array of image pixels has a center and an edge and wherein the angle at which the baffles are tilted with respect to the optical axis increases from the center to the edge.

9. The image sensor defined in claim 8 wherein at least one of the baffles is located at the center of the pixel array and wherein the angle at which the at least one baffle is tilted with respect to the optical axis is zero degrees.

10. An image sensor having an associated optical axis, comprising:

an image pixel array, wherein the image pixel array has a plurality of microlenses and wherein each microlens is associated with a chief ray angle; and a grid of light-blocking structures on the image pixel array that extend above the microlenses, wherein each light-blocking structure is tilted over an associated microlens at an angle with respect to the optical axis of the image sensor and wherein the angle at which each light-blocking structure is tilted is proportional to the chief ray angle of the associated microlens.

11. The image sensor defined in claim 10 wherein the light-blocking structures comprise a material selected from the group consisting of: metal, photoresist, carbon, and graphite.

12. The image sensor defined in claim 10 wherein the image pixel array has a center and an edge, and wherein the angle at which the light-blocking structures are tilted with respect to the optical axis increases from the center to the edge.

13. The image sensor defined in claim 10 wherein the light-blocking structures have respective lower surfaces, wherein the microlenses have respective lower surfaces, and wherein the lower surfaces of the light-blocking structures are coplanar with the lower surfaces of the microlenses.

14. The image sensor defined in claim 10 wherein at least some of the light-blocking structures have light-disrupting features to block stray light from reaching the image pixel array.

15. The image sensor defined in claim 14 wherein the light-disrupting features comprise roughened surfaces.

16. A system, comprising:

a central processing unit;

memory;

input-output circuitry; and an imaging device, wherein the imaging device comprises an image sensor having an array of image pixels and wherein the image sensor comprises:

a substrate;

an array of photodiodes formed in the substrate;

an array of microlenses formed over the array of photodiodes;

an array of color filter elements interposed between the array of microlenses and the array of photodiodes; and a grid of baffles that extend above the array of microlenses, wherein the grid of baffles is configured to block stray light from reaching the array of image pixels, wherein at least some of the baffles in the grid of baffles have light disrupting features to block stray light from reaching the array of image pixels, and wherein the light-disrupting features comprise roughened surfaces.

17. The system defined in claim 16 wherein the image sensor has an optical axis and wherein each baffle is tilted at an angle with respect to the optical axis of the image sensor.

18. The system defined in claim 16 wherein the baffles comprise a material selected from the group consisting of: metal, photoresist, carbon, and graphite.

19. The system defined in claim 17 wherein the array of image pixels has a center and an edge and wherein the angle at which the baffles are tilted with respect to the optical axis increases from the center to the edge.

* * * * *